United States Patent
Goh et al.

(10) Patent No.: US 9,450,175 B2
(45) Date of Patent: Sep. 20, 2016

(54) METHOD FOR PREPARING A LEAD-FREE PIEZOELECTRIC THIN FILM

(71) Applicant: Agency for Science, Technology and Research, Singapore (SG)

(72) Inventors: Phoi Chin Goh, Singapore (SG); Kui Yao, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/603,265

(22) Filed: Jan. 22, 2015

(65) Prior Publication Data

US 2015/0132475 A1    May 14, 2015

Related U.S. Application Data

(62) Division of application No. 13/698,989, filed as application No. PCT/SG2011/000190 on May 20, 2011, now Pat. No. 8,961,679.

(60) Provisional application No. 61/346,583, filed on May 20, 2010.

(51) Int. Cl.
    *H01L 41/318* (2013.01)
    *H01L 41/08* (2006.01)
    (Continued)

(52) U.S. Cl.
    CPC ............ *H01L 41/318* (2013.01); *C01G 33/00* (2013.01); *C01G 33/006* (2013.01); *C04B 35/495* (2013.01); *C04B 35/6264* (2013.01); *C04B 35/632* (2013.01); *C04B 35/63444* (2013.01); *C04B 35/63488* (2013.01); *H01L 41/0805* (2013.01); *H01L 41/1873* (2013.01); *C01P 2002/50* (2013.01); *C01P 2002/72* (2013.01);
    (Continued)

(58) Field of Classification Search
    CPC .................. H01L 41/0805; H01L 41/318
    USPC ........................................... 427/100
    See application file for complete search history.

(56) References Cited

U.S. PATENT DOCUMENTS

| 3,330,697 A | 7/1967 | Pechini | |
| 5,900,223 A * | 5/1999 | Matijevic | B82Y 30/00 423/263 |

(Continued)

FOREIGN PATENT DOCUMENTS

| JP | 2001127354 A | * | 5/2001 |
| WO | 2001-127354 A | | 5/2001 |
| WO | WO 2010/115493 A2 | | 10/2010 |

OTHER PUBLICATIONS

Machine translation of JP2001127354.*

(Continued)

*Primary Examiner* — Dah-Wei D Yuan
*Assistant Examiner* — Jose Hernandez-Diaz
(74) *Attorney, Agent, or Firm* — Blakely, Sokoloff, Taylor & Zafman LLP

(57) ABSTRACT

The present invention discloses a method of preparing a lead-free piezoelectric thin film comprising the steps of: providing a precursor solution comprising at least one alkali metal ion, a polyamino carboxylic acid, and an amine; depositing the precursor solution on a substrate to form a film; and annealing the film. The present invention also provides a lead-free piezoelectric thin film prepared according to the method, a precursor solution for use in the method and a method of preparing the precursor solution.

8 Claims, 5 Drawing Sheets

(51) Int. Cl.
*C04B 35/634* (2006.01)
*C01G 33/00* (2006.01)
*C04B 35/495* (2006.01)
*C04B 35/626* (2006.01)
*C04B 35/632* (2006.01)
*H01L 41/187* (2006.01)

(52) U.S. Cl.
CPC ........ *C01P 2002/89* (2013.01); *C01P 2006/32* (2013.01); *C01P 2006/40* (2013.01); *C04B 2235/3201* (2013.01); *C04B 2235/3203* (2013.01); *C04B 2235/3255* (2013.01); *C04B 2235/44* (2013.01); *C04B 2235/441* (2013.01); *C04B 2235/449* (2013.01)

(56) References Cited

U.S. PATENT DOCUMENTS

| | | |
|---|---|---|
| 6,306,204 B1 | 10/2001 | Lin |
| 2007/0024162 A1 | 2/2007 | Shibata et al. |
| 2008/0308762 A1* | 12/2008 | Ueno ................. H03H 9/02031 252/62.9 R |
| 2012/0091389 A1 | 4/2012 | Madaro et al. |
| 2013/0064970 A1 | 3/2013 | Goh et al. |

OTHER PUBLICATIONS

PCT International Search Report for PCT Counterpart Application No. PCT/SG2011/000190 containing Communication relating to the Results of the International Search Report, 4 pages, (Aug. 29, 2011).

PCT Written Opinion of the International Searching Authority for PCT Counterpart Application No. PCT/SG2011/000190, 8 pages, (Aug. 29, 2011).

PCT Written Opinion of the International Preliminary Examining Authority for PCT Counterpart Application No. PCT/SG2011/000190, 8 pages, (Apr. 10. 2012).

PCT Written Opinion of the International Preliminary Examining Authority for PCT Counterpart Application No. PCT/SG2011/000190, 9 pages, (Jun. 25, 2012).

PCT International Preliminary Report on Patentability (Chapter II of the Patent Cooperation Treaty) for PCT Counterpart Application No. PCT/SG2011/000190, 8 pages, (Aug. 29, 2012).

* cited by examiner

METHOD FOR PREPARING A LEAD-FREE PIEZOELECTRIC THIN FILM

CROSS-REFERENCE TO RELATED APPLICATIONS

This patent application is a divisional application of U.S. patent application Ser. No. 13/698,989, filed Nov. 19, 2012, which is a U.S. National Phase Application under 35 U.S.C. §371 of International Application No. PCT/SG2011/000190, filed May 20, 2011, entitled METHOD FOR PREPARING A LEAD-FREE PIEZOELECTRIC THIN FILM, which claims the benefit of and priority to U.S. Provisional Patent Application No. 61/346,583, filed May 20, 2010.

TECHNICAL FIELD

The present invention relates to a method for preparing a lead-free piezoelectric thin film. The present invention also relates to a lead-free piezoelectric thin film obtained from the method.

BACKGROUND

Lead-based piezoelectric materials have been widely used in sensors, actuators, transducers, and many other electronic devices. The increasing applications of these devices generate a more aggravated environmental concern because these traditional lead-based piezoelectric ceramics typically contain more than 60% lead by weight. Intensive efforts have been made to develop lead-free piezoelectric materials to replace the lead-based compositions. Potassium sodium niobate (Group IA-VB) system is one of the most promising candidates as a lead-free piezoelectric ceramic material. Potassium sodium niobate, $(K,Na)NbO_3$ (KNN) based ceramics have a broad operation temperature range due to high Curie temperature of about ~420° C., and large piezoelectric coefficient in the bulk ceramic.

For the applications in various microelectronics and micro electromechanical devices and systems (MEMS), lead-free piezoelectric thin films instead of bulk ceramics are demanded. However, it is highly challenging to obtain KNN-based piezoelectric thin films with excellent piezoelectric performance properties. The piezoelectric coefficient for KNN thin films is typically far below the expected value as compared to the bulk counterparts. The effective du values for the KNN thin and thick films from a chemical solution deposition method are in the range of 40 to 61 pm/V. For KNN thin films prepared by a physical deposition method such as sputtering and pulsed laser deposition, the effective $d_{33}$ is ~50 pm/V. Under similar testing conditions, the effective $d_{33}$ for PZT thin film with the constraint from a substrate could be in the range of 70 to 130 pm/V. Accordingly, it can be seen that the piezoelectric performance property of KNN thin films is substantially inferior to that of PZT thin films. There is therefore a need for an improvement on the piezoelectric performance of KNN thin films.

The high volatility of the alkali elements (including potassium and sodium) during thermal processing due to their high vapour pressure is a major reason for the difficulty in the control of the composition and obtaining excellent properties of the resulting KNN thin films. Evaporation of the alkali ions causes the formation of oxygen vacancies in the films, and hence large leakage and poor piezoelectric properties. One way is to add significant excess of potassium and/or sodium compositions in the precursor solution for the chemical solution approach or in the targets for sputtering or pulsed-laser deposition (PLD) method, aiming at compensation for the loss of these alkali ions during the thermal processing. Some improvement in the properties of the resulting KNN films is observed when excess potassium and/or sodium are introduced. However, this causes uncertainty and difficulty in controlling the compositional stoichiometry for the obtained KNN thin films and thus large leakage current still exists due to the uncontrolled volatilization of alkali ions, which limits the improvement of the piezoelectric properties.

SUMMARY OF THE INVENTION

The present invention seeks to address these problems, and provides an improved method for preparing a lead-free piezoelectric thin film, and a precursor solution for use in the method for preparing a lead-free piezoelectric thin film.

According to a first aspect, there is provided a precursor solution for use in preparing a lead-free piezoelectric thin film. The precursor solution comprises: at least one alkali metal ion; a polyamino carboxylic acid; and an amine.

Any suitable alkali metal ion may be comprised in the precursor solution. For example, the at least one alkali metal ion may be an ion of a Group IA metal. In particular, the at least one alkali metal ion may be selected from the group consisting of: potassium (K), sodium (Na) and lithium (Li). Even more in particular, the precursor solution may comprise K and Na ions.

The polyamino carboxylic acid comprised in the precursor solution may be any suitable polyamino carboxylic acid for the purposes of the present invention. For example, the polyamino carboxylic acid may be selected from a group consisting of: ethylenediaminetetraacetic acid (EDTA), diethylenetriaminepentaacetic acid (DTPA), ethylene glycol-bis(beta-aminoethyl ether)-tetraacetic acid (EGTA), (2-hydroxyethyl)ethylenediamine triacetic acid (HEDTA) and 1,3-diamino-2-hydroxypropane-tetraacetic acid (HPDTA). In particular, the polyamino carboxylic acid may be EDTA.

The amine comprised in the precursor solution may be any suitable amine for the purposes of the present invention. For example, the amine may be an alkanolamine. In particular, the amine may be selected from a group consisting of: diethanolamine (DEA), ethylenediamine (EDA) and polyethyleneimine (PEI). Even more in particular, the amine may be DEA.

According to a particular aspect, the precursor solution may further comprise a Group VB metal ion. For example, the Group VB metal ion may be a niobium (Nb) ion.

According to a particular aspect, the precursor solution may comprise a solution of $ABO_3$, wherein A is an alkali metal ion and B is a Group VB metal ion. In particular, the precursor solution may comprise a solution of potassium sodium niobate, $(K,Na)NbO_3$ (KNN).

According to a particular aspect, the precursor solution may comprise EDTA, DEA and KNN in a molar ratio of x:y:z, wherein x is 0.125-3, y is 0.85-2.5, and z is 1. In particular, the precursor solution may comprise EDTA, DEA and KNN in a molar ratio of x:y:z, wherein x is 0.25, y is 2.1 and z is 1.

According to a second aspect, the present invention provides a method of preparing a precursor solution as described above comprising the steps of:

preparing a first solution comprising the at least one alkali metal ion;

preparing a second solution comprising the polyamino carboxylic acid and the amine; and mixing the first solution and the second solution to form the precursor solution.

The at least one alkali metal ion, polyamino carboxylic acid, and amine may be as described above.

According to a particular aspect, the first solution may further comprise a Group VB metal ion. In particular, the Group VB metal ion may be as described above.

According to a particular aspect, the first solution may comprise potassium and sodium ions. In particular, the first solution may comprise potassium, sodium and niobium ions. Even more in particular, the first solution may be a solution of potassium sodium niobate, (K,Na)NbO$_3$ (KNN). The second solution may comprise EDTA and DEA. In particular, the second solution may be an EDTA-DEA solution.

In particular, the precursor solution may comprise an EDTA-DEA modified KNN solution.

According to a third aspect, the present invention also provides a method for preparing a lead-free piezoelectric thin film comprising the steps of:

providing a precursor solution according to the first aspect of the present invention;

depositing the precursor solution on a substrate to form a film; and annealing the film.

The precursor solution may be as described above. The precursor solution may be prepared according to the method of the second aspect of the present invention. The substrate may be any suitable substrate. For example, the substrate may be a silicon substrate. In particular, the substrate may be a silicon substrate pre-coated with a layer of SiO$_2$, Ti and Pt.

According to a particular aspect, the method may further comprise a step of decomposing the film by heating prior to the step of annealing. The step of decomposing may comprise heating the film at a suitable temperature.

According to a particular aspect, the steps of depositing and decomposing may be repeated at least once prior to the step of annealing. In particular, the steps of depositing and decomposing may be repeated until the desired thickness of the film is achieved.

The step of annealing may comprise heating the film at an elevated temperature. Any suitable temperature may be used for the purposes of the present invention. In particular, the step of annealing may comprise heating the film at a temperature of about 580-700° C.

The lead-free piezoelectric thin film may have a formula of (K$_{0.5}$Na$_{0.5}$)NbO$_3$.

The method may further comprise a step of depositing a solution comprising lithium ions on the film after the step of annealing. The method may further comprise a step of heating the film comprising the solution comprising lithium ions and subsequently annealing the film for a second time. According to a particular aspect, the annealing may be carried out at a temperature of about 700° C. Accordingly, the lead-free piezoelectric thin film may have a formula of 0.06LiNbO$_3$-0.94(K$_{0.5}$Na$_{0.5}$)NbO$_3$.

According to another aspect, the present invention provides a lead-free piezoelectric thin film obtained from the method according to the third aspect. In particular, the lead-free piezoelectric thin film may have an effective piezoelectric coefficient, d$_{33}$ of ≥80 pm/V.

The present invention also provides a device comprising the lead-free piezoelectric thin film according to the present invention. The device may be any suitable device which requires a piezoelectric thin film. In particular, the device may be, but not limited to, a sensor, actuator, or a transducer.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings. In the drawings.

DETAILED DESCRIPTION OF THE INVENTION

Figure 1:
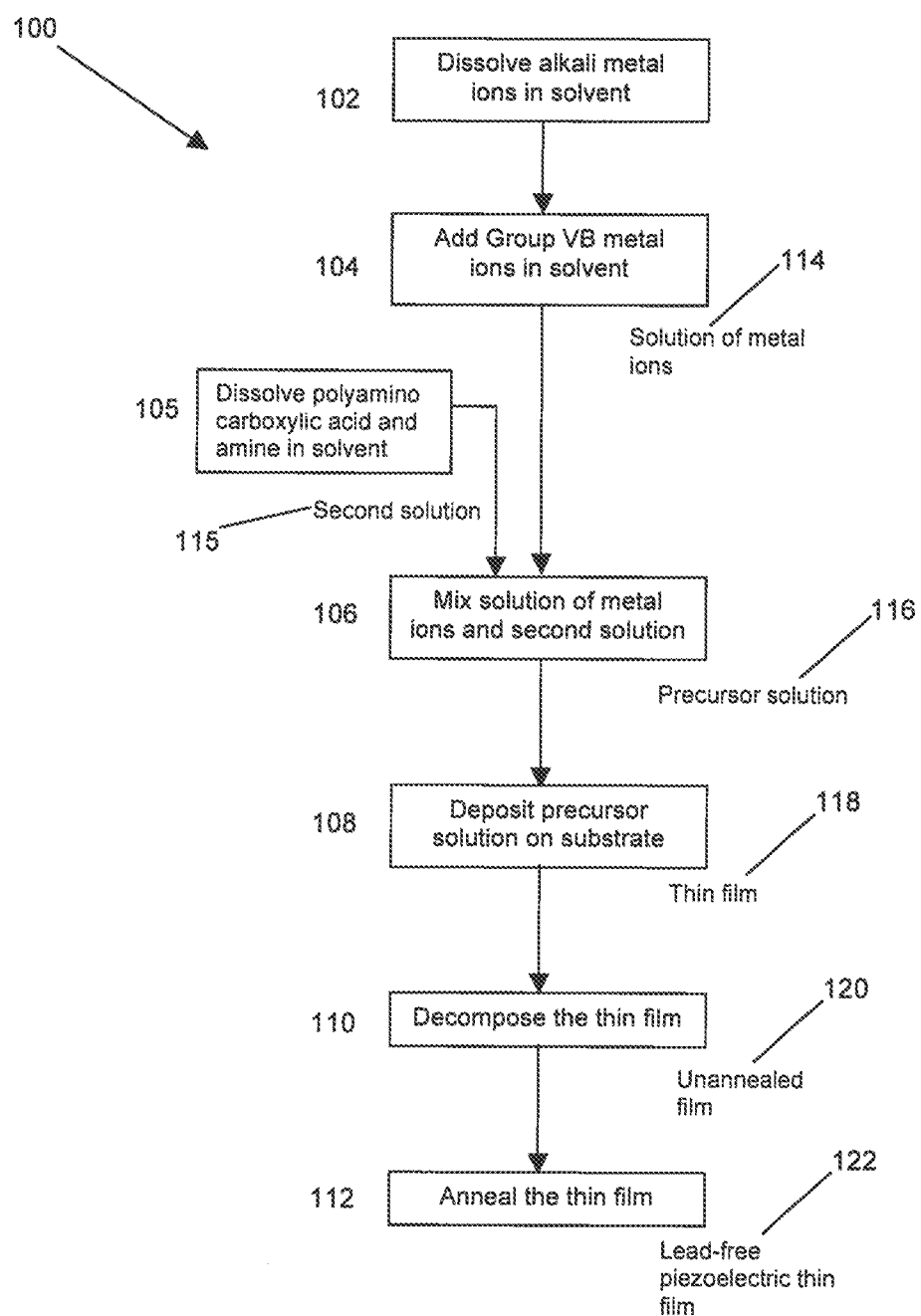
FIG. 1 is a flow chart showing the general method of preparing a lead-free piezoelectric thin film according to the present invention.

The exemplary embodiments aim to provide a simple and scalable method for preparing lead-free piezoelectric thin films. The lead-free piezoelectric thin films prepared from the method of the present invention have piezoelectric properties, such as an effective piezoelectric coefficient (d$_{33}$), which are comparable with that of lead-containing piezoelectric thin films such as PZT thin films. In particular, the method may be most suited for preparing lead-free oxide piezoelectric thin films.

The lead-free piezoelectric thin films may comprise any suitable metal element other than lead. In particular, the lead-free piezoelectric thin films may comprise Group IA metal elements. Even more in particular, the lead-free piezoelectric thin films may comprise alkali metals. Accordingly, a suitable precursor solution must be used for preparing the lead-free piezoelectric thin films in order to stabilise the alkali metals.

According to a first aspect, there is provided a precursor solution for use in preparing a lead-free piezoelectric thin film, the precursor solution comprising: at least one alkali metal ion; a polyamino carboxylic acid; and an amine.

The alkali metal ion may be any suitable alkali metal ion. For example, the at least one alkali metal ion may be an ion of a Group IA metal such as lithium (Li), sodium (Na), potassium (K), rubidium (Rb). In particular, the at least one alkali metal ion may be potassium (K), sodium (Na) or lithium (U) ions. Even more in particular, the precursor solution may comprise K and Na ions.

The at least one alkali metal ion may be comprised in the precursor solution in any suitable form. For example, the precursor solution may comprise suitable compounds comprising the at least one alkali metal ion. In particular, the precursor solution may comprise an acetate of the at least one alkali metal ion. Even more in particular, the precursor solution may comprise sodium acetate ($CH_3COONa$) and potassium acetate ($CH_3COOK$).

The at least one alkali metal ion in the precursor solution may be comprised in a solvent. Any suitable solvent may be used for the purposes of the present invention. For example, the solvent may contain an ether group or an alcohol. In particular, the solvent may be a glycol ether. Even more in particular; the solvent may be 2-methoxyethanol (2-MOE).

The polyamino carboxylic acid may be any suitable polyamino carboxylic acid. For the purposes of the present invention, a polyamino carboxylic acid may be defined as a compound containing one or more nitrogen atoms connected through carbon atoms to one or more carboxyl groups. For example, the polyamino carboxylic acid may be selected from a group consisting of, but not limited to: ethylenediaminetetraacetic acid (EDTA) (($HO_2CCH_2)_2NCH_2CH_2N(CH_2CO_2H)_2$), diethylenetriaminepentaacetic acid (DTPA) ((($HO_2CCH_2)_2NCH_2CH_2)_2NCH_2CO_2H$), ethylene glycol-bis(beta-aminoethyl ether)-tetraacetic acid (EGTA) (($CH_2OCH_2CH_2N(CH_2CO_2H))_2$), (2-hydroxyethyl)ethylenediamine triacetic acid (HEDTA) ($HOCH_2CH_2N(CH_2CO_2H)CH_2CH_2N(CH_2CO_2H)_2$) and 1,3-diamino-2-hydroxypropane-tetraacetic acid (HPDTA) (($HO_2CCH_2)_2NCH_2CH(OH)CH_2N(CH_2CO_2H)_2$). In particular, the polyamino carboxylic acid may be EDTA.

The amine may be any suitable amine. For example, the amine may be an alkanolamine. In particular, the amine may be selected from a group consisting of, but not limited to: diethanolamine (DEA) ($NH(CH_2CH_2OH)_2$), ethylenediamine (EDA), and polyethyleneimine (PEI) ($H(NHCH_2CH_2)_nNH_2$). Even more in particular, the amine may be DEA.

According to a particular aspect, the polyamino carboxylic acid and the amine may be dissolved in a solvent. Any suitable solvent may be used for the purposes of the present invention. For example, the solvent may contain an ether group or an alcohol. In particular, the solvent may be a glycol ether. Even more in particular, the solvent may be 2-methoxyethanol (2-MOE).

According to a particular aspect, the precursor solution may further comprise a Group VB metal ion. The Group VB metal ion may be any suitable metal ion. For example, the Group VB metal ion may be a niobium (Nb) ion.

The at least one Group VB metal ion may be comprised in the precursor solution in any suitable form. For example, the precursor solution may comprise suitable compounds comprising the Group VB metal ion. In particular, the precursor solution may comprise an ethoxide of the Group VB metal ion. Even more in particular, the precursor solution may comprise niobium ethoxide (($CH_3CH_2O)_5Nb$).

According to a particular aspect, the precursor solution may comprise a solution of $ABO_3$, wherein A is an alkali metal and B is a Group VB metal. For example, the alkali metal may be any suitable alkali metal as described above and the Group VB metal may be any suitable Group VB metal as described above. In particular, A may comprise one or more alkali metal. Even more in particular, A may be potassium and sodium. In particular, the Group VB metal may be niobium. Even more in particular, the precursor solution may comprise a solution of potassium sodium niobate, $(K,Na)NbO_3$ (KNN).

According to a particular aspect, the precursor solution may comprise EDTA, DEA, potassium ions, sodium ions and niobium ions. In particular, the precursor solution may comprise EDTA, DEA and KNN solution. For example, the precursor solution may comprise EDTA, DEA and KNN in a molar ratio of x:y:z, wherein x is 0.125-3, y is 0.86-2.5, and z is 1. In particular, the precursor solution may comprise EDTA, DEA and KNN in a molar ratio of x:y:z, wherein x is 0.25, y is 2.1 and z is 1.

According to a second aspect of the present invention, there is provided a method of preparing a precursor solution as described above. The method of preparing the precursor solution comprises the steps of:
preparing a first solution comprising at least one alkali metal ion;
preparing a second solution comprising a polyamino carboxylic acid and an amine; and
mixing the first solution and the second solution to form the precursor solution.

The method of preparing the precursor solution may be generally shown as steps 102 to 106 of FIG. 1. Each of these steps will now be described in more detail.

Step 102 comprises preparing the first solution by mixing the at least one alkali metal ion in a solvent to form a solution. Any suitable alkali metal may be used. The at least one alkali metal may be in any suitable form. For example, the at least one alkali metal may be an acetate of the at least one alkali metal. The solvent used in step 102 may be any suitable solvent. If the first solution is to comprise more than one alkali metal ion, a suitable form of each of the alkali metals is mixed in the solvent.

The first solution may further comprise Group VB metal ions. Any suitable Group VB metal may be used. In particular, the method 100 may further comprise a step 104 of adding Group VB metal ions to the solution obtained from the step 102 by mixing a Group VB metal in a suitable form to form a solution of alkali metal ions and Group VB metal ions 114. For example, an ethoxide of the Group VB metal may be mixed into the solution obtained from the step 102.

Step 105 comprises dissolving a polyamino carboxylic acid and an amine in a solvent form a second solution 115. The polyamino carboxylic acid and amine may be any suitable polyamino carboxylic acid and amine. Any suitable solvent may be used for dissolving the polyamino carboxylic acid and the amine.

The second solution 115 and the solution of alkali metal ions and Group VB metal ions 114 are then mixed together in step 106 to form a precursor solution 116.

In particular, the at least one alkali metal ion, Group VB metal ion, polyamino carboxylic acid, amine and solvent may be as described above.

According to one embodiment, step 102 comprises dissolving sodium acetate ($CH_3COONa$) and potassium acetate ($CH_3COOK$) in 2-methoxyethanol (2-MOE) to form a potassium-sodium acetate solution. Step 104 comprises adding niobium ethoxide (($CH_3CH_2O)_5Nb$) to the potassium-sodium acetate solution to form a potassium sodium niobate (($K,Na)NbO_3$) (KNN) solution 114.

In step 105, EDTA and DEA are dissolved in 2-MOE to form an EDTA-DEA solution 115. The KNN solution 114 and the EDTA-DEA 115 solution are then mixed together in step 106 to form an EDTA-DEA modified KNN solution as the precursor solution 116.

According to a third aspect, the present invention provides a method for preparing a lead-free piezoelectric thin film comprising the steps of:
providing a precursor solution;
depositing the precursor solution on a substrate to form a film; and
annealing the film.

The method 100 for preparing the lead-free piezoelectric thin film may generally comprise the steps as shown in FIG. 1.

The precursor solution may be any suitable precursor solution. In particular, the precursor solution may be as described above. Even more in particular, the precursor solution may be prepared according to the method as described above. For example, the precursor solution may be prepared according to the steps 102 to 106 of FIG. 1.

Once the precursor solution 116 is prepared, the precursor solution 116 is deposited on a substrate to form a film 118. Any suitable method of depositing the precursor solution 116 on a substrate may be used for the purposes of the present invention. For example, the step 108 of depositing the precursor solution 116 on a substrate may comprise spin coating, dip-coating, chemical vapour deposition and the like. In particular, the step 108 of depositing the precursor solution may comprise spin coating the precursor solution 116 on a substrate to form a film 118. The spin coating may be carried out under conditions suitable for the purposes of the present invention.

The substrate may be any suitable substrate. For example, the substrate may be a SI, MgO, ZnO, $SrTiO_3$ or $SrRuO_3$ substrate. In particular, the substrate may be a silicon (Si) substrate.

According to a particular aspect, the substrate may be pre-coated prior to the step 108 of depositing the precursor solution 116. For example, the substrate may be pre-coated with an oxide film. In particular, the substrate may be pre-coated with a layer of $SiO_2$, Ti and Pt. According to a particular aspect, the substrate may be a Si substrate pre-coated with a layer of $SiO_2$, Ti and Pt (Pt/Ti/$SiO_2$/Si substrate).

The method 100 may further comprise a step 110 of decomposing the film 118 deposited on the substrate by heating the film 118 prior to the step 112 of annealing. The step 110 of decomposing comprises drying the film 118 and subjecting the film 118 to a pyrolysis process. In particular, the step 110 may comprise heating the film 118 to an elevated temperature of about 300-400° C. to obtain an unannealed film 120. The step 110 of decomposing the film 118 decomposes the organic components within the film 118. In particular, the step 110 of decomposing the film 118 decomposes the a polyamino carboxylic acid and the amine comprised in the film 118.

The thickness of the film 118 deposited on the substrate may be controlled by controlling the number of times the step 108 of depositing the precursor solution 116 is carried out. According to a particular aspect, the steps 108, 110 of depositing and decomposing may be repeated at least once prior to the step 112 of annealing. In particular, the step 110 of decomposing may be carried out after every step 108 of depositing. The steps 108, 110 of depositing and decomposing may be repeated until the desired thickness of the film 120 is achieved. In particular, the method 100 may comprise depositing the film 118, decomposing the film 118 followed by a further round of depositing and decomposing. For example, multiple spin-coating cycles may be performed to obtain a film 120 of desired thickness.

The unannealed film 120 is then subjected to a step 112 of annealing the unannealed film 120 to form the lead-free piezoelectric thin film 122. The step 112 of annealing may be carried out at any suitable temperature for the purposes of the present invention. In particular, the step 112 of annealing may be carried out at a temperature of about 500-800° C. under suitable conditions. Even more in particular, the step 112 of annealing may be carried out at a temperature of about 580-700° C. The step 112 of annealing may be carried out for a suitable period of time. For example, the step 112 of annealing may be carried out for about 8-15 minutes. In particular, the step 112 of annealing may be carried out for about 10 minutes. The step 112 of annealing may be carried out in air. The temperature at which the step 112 of annealing is carried out may be ramped at a suitable rate. For example, the ramping rate may be 20-40° C./min. In particular, the ramping rate may be about 30° C./min. The step 112 of annealing may result in the crystallizing of the lead-free piezoelectric thin film.

The lead-free piezoelectric thin film 122 prepared from the method 100 may be a lead-free oxide piezoelectric thin film. According to a particular aspect, the lead-free piezoelectric thin film 122 may comprise $ABO_3$, wherein A is an alkali metal and B is a Group VB metal. For example, the alkali metal may be any suitable alkali metal as described above and the Group VB metal may be any suitable Group VB metal as described above. In particular, A may comprise one or more alkali metal. Even more in particular, A may be potassium and sodium. In particular, the Group VB metal may be niobium.

According to a particular aspect, the lead-free piezoelectric thin film 122 may be potassium sodium niobate, $(K,Na)NbO_3$ (KNN). In particular, the lead-free piezoelectric thin film 122 may be $(K_{0.5}Na_{0.5})NbO_3$.

According to another particular aspect, the lead-free piezoelectric thin film 122 may further comprise a dopant. Accordingly, the method 100 may comprise a further step of introducing a dopant to the lead-free piezoelectric thin film 122. The lead-free piezoelectric thin film 122 may be doped with any suitable metal. For example, the lead-free piezoelectric thin film 122 may be doped with at least one metal selected from the group consisting of, but not limited to: lithium, tantalum and antimony. In particular, the lead-free piezoelectric thin film 122 may be doped with lithium. The method described above may therefore comprise a further step of introducing a small amount of lithium into the lead-free piezoelectric thin film 122.

Therefore, the method 100 for preparing a lead-free piezoelectric thin film may further comprise a step of depositing a solution comprising dopant ions on the film 122 after the step 112 of annealing. The step of depositing the solution comprising the dopant ions may comprise any suitable method. The step of depositing the solution comprising the dopant ions may be as described above in relation to the step 108 of depositing the precursor solution 116 on a substrate.

Subsequently, the method 100 may further comprise the steps of decomposing the film on which the solution comprising the dopant ions is deposited and annealing the film to form a metal-doped lead-free piezoelectric thin film. The conditions for the steps of decomposing and annealing may be as described above in relation to steps 110 and 112.

According to a particular embodiment, the dopant may be lithium. Accordingly, a solution of lithium ions may be prepared by dissolving lithium acetylacetonate ($CH_3COCH\!=\!C(OLi)CH_3$) in 2-MOE. The solution of lithium ions may then be deposited on the lead-free piezoelectric film prepared from the method described above by spin coating. The lead-free piezoelectric film with the solution of lithium is then heated at a suitable temperature to dry the film and to subject the film to a pyrolysis process. In particular, the lead-free piezoelectric film with the solution of lithium is heated to a temperature of about 300-400° C. The lead-free piezoelectric film with the solution of lithium is then annealed under conditions similar to the conditions of the step 112 of annealing described above to form a metal-doped lead-free piezoelectric thin film. In particular, the lead-free piezoelectric film with the solution of lithium is annealed at a temperature of about 700° C. for 10 minutes in air.

According to a particular aspect, the metal-doped lead-free piezoelectric thin film formed from the method above may be $LiNbO_3$—$(K_{0.5}Na_{0.5})NbO_3$. Even more in particular, the metal-doped lead-free piezoelectric thin film formed from the method described above may be $0.0LiNbO_3$-$0.94$ $(K_{0.5}Na_{0.5})NbO_3$.

During the step of heating and annealing of the lead-free piezoelectric film with the solution of lithium, the lithium solution diffuses into the lead-free piezoelectric film 122 to form a thin film with a single perovskite phase of the solid solution of the lithium ions and the lead-free piezoelectric film with orthorhombic crystallographic symmetry. Accordingly, the piezoelectric coefficient of the resultant lead-free piezoelectric film which is doped is higher than that of the lead-free piezoelectric film 122 obtained from the method 100 as described above. In particular, when the lead-free piezoelectric film 122 is KNN, the lithium solution diffuses into the KNN film to form a thin film with a single perovskite phase of the solid solution of $LiNbO_3$—KNN (LKNN) with orthorhombic crystallographic symmetry. Accordingly, the piezoelectric coefficient of the LKNN film is higher than that of the KNN film without lithium doping.

According to another aspect of the present invention, there is provided a lead-free piezoelectric thin film obtained from the method according to any aspect of the present invention. The present invention also provides a lead-free piezoelectric thin film prepared from the precursor solution as described above. In particular, the lead-free piezoelectric thin film may be a lead-free oxide piezoelectric thin film. Even more in particular, the lead-free piezoelectric thin film may be a KNN piezoelectric thin film.

The lead-free piezoelectric thin film according to the present invention may have desirable properties. In particular, the lead-free piezoelectric thin film may have properties which are comparable to that of lead-containing piezoelectric thin films. For example, the lead-free piezoelectric thin film has a high effective piezoelectric coefficient, $d_{33}$ which is comparable to PZT thin films, and a low leakage current. According to a particular aspect, the lead-free piezoelectric thin film according to the present invention may have an effective piezoelectric coefficient, $d_{33}$ of $\geq 80$ pm/V. The lead-free piezoelectric thin film of the present invention is therefore advantageous as the thin film is able to eliminate the environmental hazards present in existing commercial piezoelectric thin films which contain up to 60% by weight of lead, while demonstrating outstanding piezoelectric performance properties.

In the lead-free piezoelectric thin film according to any aspect of the present invention, the volatility of the alkali metal ions are suppressed, thus resulting in the improved piezoelectric performance properties. The polyamino carboxylic acid and the amine comprised in the precursor solution stabilise the alkali metal ions in the precursor solution. Accordingly, the leakage current is significantly reduced and the piezoelectric performance properties, such as the piezoelectric coefficient, are improved. The polyamino carboxylic acid and the amine immobilize the alkali metal ions by forming chemical networks comprising the polyamino carboxylic acid, amine and the alkali metal ions. The interactions between the polyamino carboxylic acid and the amine, or their residues after the step of decomposing, and the alkali metal ions are maintained until the crystallisation of the lead-free piezoelectric thin film during the step of annealing. In this way, the volatilization of the alkali metal ions during the step of decomposing, particularly the pyrolysis process is significantly suppressed at low temperatures.

In particular, the present invention shows the unexpected result of the polyamino carboxylic acid being able to have a chelating effect on the alkali metal ions. This is unexpected because alkali metal ions do not have an extra orbital for accepting the lone pair electrons from either the oxygen or nitrogen elements in the functional group of the polyamino carboxylic acid.

For example, according to one embodiment of the present invention, EDTA unexpectedly shows a chelating effect on the alkali metal ions. Further, the stability constant of EDTA and alkali metal ions is significantly lower compared to transition metal ions or metal ions of other groups of the Periodic Table. Low stability constants indicate that it is less likely for an EDTA-alkali metal ion complex to be formed in solution, and accordingly, the formation of chemical networks as explained above would not be expected.

Further, it is also known in the art that neutral oxygen donors such as crown ethers, a and polyethylene glycols are more suitable and show high selectivity for chelating to alkali metal ions by forming stable six-member ring complexes in a solution. However, both EDTA and DEA are not neutral oxygen donors and therefore it would not be expected for EDTA-DEA to form a complex with alkali metal ions.

According to another aspect, the present invention also provides a device comprising the lead-free piezoelectric thin film according to any aspect of the present invention. The device may be any suitable device which requires a piezoelectric thin film. In particular, the device may be, but not limited to, a sensor, actuator, or a transducer. For example, the device may be a piezoelectric sensor, piezoelectric actuator or piezoelectric transducer, including other piezoelectric devices for biomedical applications and applications at home for domestic use.

Having now generally described the invention, the same will be more readily understood through reference to the following examples which are provided by way of illustration, and are not intended to be limiting.

EXAMPLES (a) Example 1

Preparation of KNN Piezoelectric Thin Film from Precursor Solution Comprising EDTA and DEA Ethylenediaminetetraacetic acid (EDTA) ($(HO_2CCH_2)_2NCH_2CH_2N(CH_2(CO_2)_2)$) and diethanolamine (DEA) ($HN(CH_2CH_2OH)_2$), were used in the preparation of a chemical precursor solution for use in the preparation of potassium sodium niobate, $(K,Na)NbO_3$ (KNN) piezoelectric thin films. The method used in the preparation of the KNN thin film from the chemical precursor solution modified with EDTA and DEA is schematically illustrated in FIG. 2.

Figure 2:
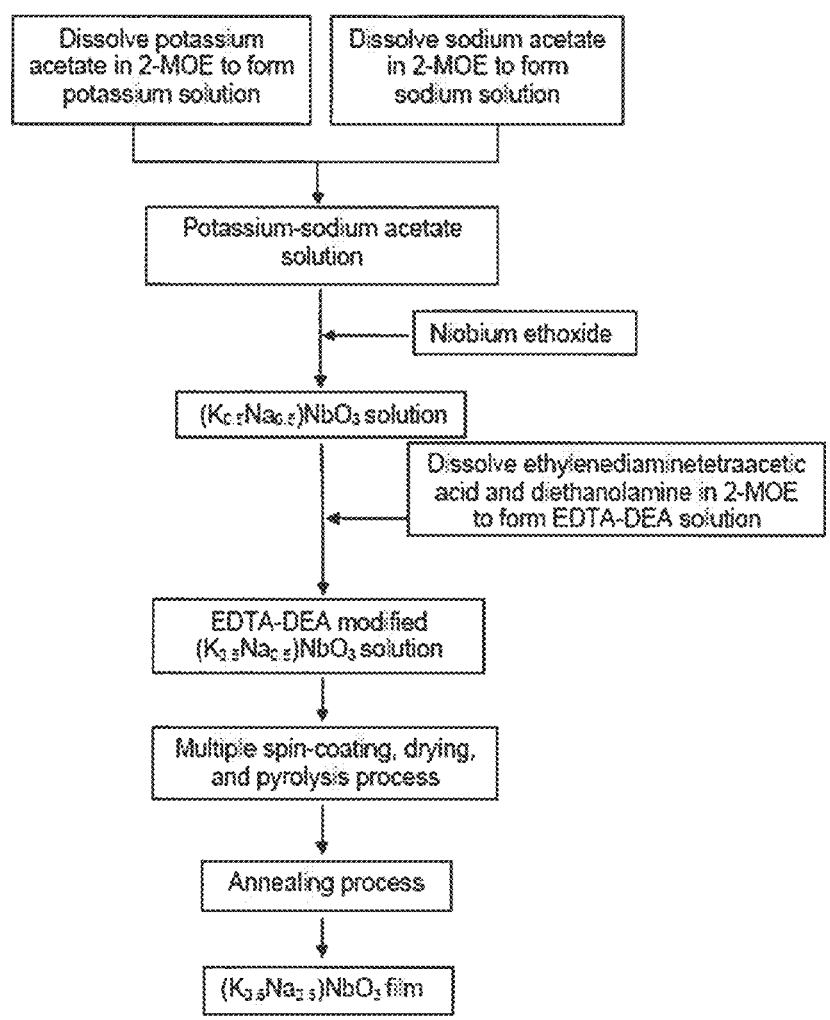
FIG. 2 shows a flow chart showing the method of preparing a (K,Na)NbO$_3$ (KNN) piezoelectric thin film according to an embodiment of the method of the present invention.

As shown in FIG. 2, solutions of KNN and EDTA-DEA were prepared separately, followed by mixing of these two solutions together, at room temperature under a nitrogen environment in a glove box.

In particular, for the preparation of the KNN solution, 0.87 g potassium acetate powder ($CH_3COOK$) (Aldrich) and 0.73 g of sodium acetate powder ($CH_3COONa$) (Aldrich) were dissolved separately in 10.6 mL of 2-methoxyethanol (2-MOE) solvent (Sigma-Aldrich). These two solutions were then mixed together to form a potassium-sodium acetate solution. Minor excesses of potassium acetate powder and sodium acetate powder were added into the potassium-sodium acetate solution to compensate for the loss of potassium and sodium during the subsequent heat treatment processes. 4 mL of niobium ethoxide (($CH_3CH_2O)_5Nb$) (Aldrich) was then added to the potassium-sodium acetate solution and dissolved completely to form a ($K_{0.5}Na_{0.5}$)$NbO_3$ (KNN) solution.

The next step involved the preparation of the EDTA-EDA solution. 1.19 g of EDTA (Aldrich) and 3.3 mL of DEA (Sigma-Aldrich) were dissolved together in 11.5 mL of 2-MOE solvent to form EDTA-DEA solution. The mixture was stirred at room temperature for 2 hours to yield a clear solution. EDTA powder alone was not soluble in 2-MOE solvent. This is because EDTA is a polar solute that has very low solubility in 2-MOE, which is a low polar solvent. The addition of DEA, which has an amine functional group, into the mixture of EDTA and 2-MOE deprotonates the EDTA according to the Lewis acid base reaction (Equation 1) to yield EDTA$^+$ that has higher solubility strength in 2-MOE and protonated DEA (DEAH$^+$).

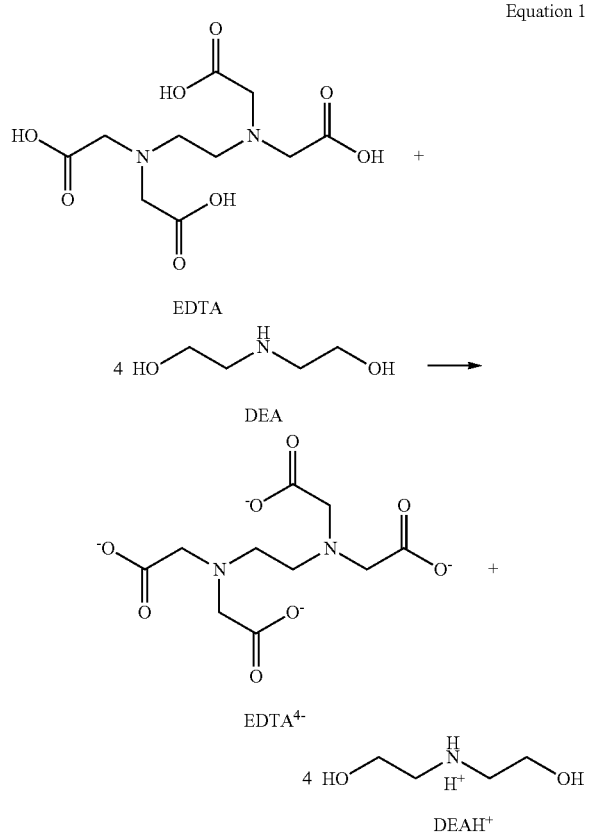

Equation 1

The EDTA-DEA solution was then mixed with the KNN solution to obtain an EDTA-DEA modified KNN chemical precursor solution with a molar concentration of 0.4M. In particular, the molar ratio of EDTA to DEA to KNN in the solution was 0.25:2.1:1.

The KNN chemical precursor solution was then spin coated on a silicon substrate with a prior-coated layer of $SiO_2$, Ti, and Pt (Pt/Ti/$SiO_2$/Si substrate) at 4000 rpm to form a film on the substrate. Nine cycles of spin-coating yielded a film thickness of 1.26 μm (9 layers in total). After each cycle of spin-coating, each layer went through a drying and pyrolysis process at 100° C. and 330° C., respectively to decompose the organic composition. Finally, the film was annealed for 10 minutes at a temperature of 580-700° C. in air with a ramping rate of 30° C./min for a more complete removal of the organic radicals and crystallization of the KNN phase to form a KNN piezoelectric thin film.

The properties of the KNN piezoelectric thin film were then tested and examined as follows.

(i) X-ray diffraction (XRD) was performed to examine the crystallographic structure of the KNN piezoelectric thin film at room temperature using Cu—Ka radiation (λ=0.15418 nm) (D8-Advance, Bruker AXS GmbH).

(ii) To test the electrical properties of the KNN piezoelectric thin film, gold top electrodes were deposited by the sputtering process and patterned through a shadow mask. The Pt layer below the KNN film was used as the bottom electrode, with one local area exposed by wet etching the KNN piezoelectric thin film. Prior to the characterization of the piezoelectric property of the KNN piezoelectric thin film, the film was first poled with a DC bias using a source meter at 200 kV/cm at room temperature. A laser scanning vibromoter (LSV, OFV 056, Polytec, Tustin, Calif.) was used to measure the dilatation of the KNN piezoelectric thin film excited by an AC electric field. A three-dimensional view of the piezoelectric displacement of the KNN piezoelectric thin film over a large area was obtained with the laser scanning measurement and the dilatation of the KNN piezoelectric thin film was determined from the difference in the displacements between the regions with and without the gold electrode coverage. Effective piezoelectric coefficient under the constraint of the substrate, $d_{33}$, was calculated based on Equation 2.

$$d_{33} = \frac{\delta}{V} \quad \text{Equation 2}$$

where δ is the dilatation of the KNN piezoelectric thin film and V is the magnitude of the applied voltage.

(iii) The current-voltage (I-V) characteristics of Au/KNN/Pt capacitors were measured using an electric meter (Keithley 6517A) at room temperature with voltage ranging from −12.6 to +12.6 V (equivalent to electric field of +/−103.2 kV/cm).

(b) Example 2

Preparation of KNN Piezoelectric Thin Film from Precursor Solution Comprising EDTA and EDA The present example is similar to Example 1 except that 2 mL of ethylenediamine (EDA) ($NH_2CH_2CH_2NH_2$) (Aldrich) instead of DEA was used in the precursor solution. The EDA, which also has amine functional groups, was selected to replace the DEA as described in Example 1 above, in consideration that it also has the ability to enhance the solubility of EDTA in 2-MOE through the Lewis acid based reaction (Equation 3).

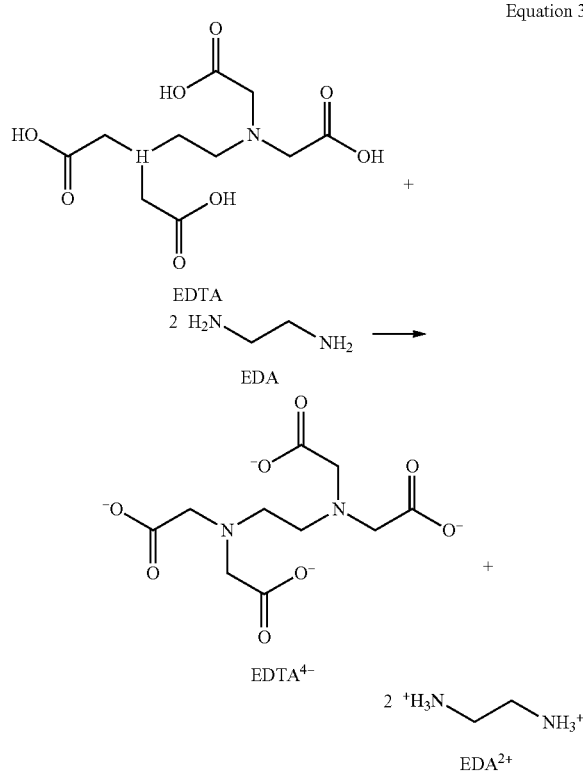

Equation 3

The KNN piezoelectric thin film preparation process was similar to Example 1.

(c) Example 3

Preparation of KNN Piezoelectric Thin Film from Precursor Solution Comprising Either EDA or DEA Only

The preparation process for the KNN piezoelectric thin films was similar to Example 1 except that only DEA or only EDA instead of EDTA-DEA was introduced in the precursor solution. The KNN piezoelectric thin films derived from the DEA-modified solution and the EDA-modified solutions were annealed at different temperatures and their performance properties were characterized for comparison purposes.

(d) Example 4

Preparation of KNN Piezoelectric Thin Film from Precursor Solution Comprising No Chelating Agents

The preparation process for the KNN piezoelectric thin film was similar to Example 1 except that no EDTA-DEA or any other chelating agent was introduced into the precursor solution.

(e) Example 5

Preparation of KNN Piezoelectric Thin Film from Precursor Solution Comprising Chelating Agents Other than a Polyamino Carboxylic Acid and/or Amine

Many other chelating agents, including acetylacetone (AcAc) (Sigma-Aldrich), citric acid (CA) (Sigma-Aldrich), polyethylene glycol (PEG) (Sigma-Aldrich), and polyvinylpyrrolidone (PVP) (Sigma-Aldrich), were added into the KNN precursor to replace the EDTA and DEA added in the precursor solution of Example 1, and KNN thin films were obtained with similar processing conditions to that in Example 1.

(f) Example 6

Preparation of Lithium-Doped KNN Piezoelectric Thin Film from Precursor Solution Comprising EDTA and EDA

The EDTA-DEA modified KNN piezoelectric thin film was first prepared according to the same method as disclosed in Example 1.

A precursor solution of lithium was prepared separately by dissolving 0.1 g of lithium acetylacetonate ($CH_3COCH=C(OLi)CH_3$) (Aldrich) into 10 mL of 2-MOE solvent (Sigma-Aldrich) with a molar concentration of 0.1M. The lithium precursor solution was then spin coated at 4000 rpm on the EDTA-DEA modified KNN piezoelectric thin film obtained from Example 1. The resulting film went through a series of drying and pyrolysis process, at the same temperatures used in preparing the EDTA-DEA modified KNN piezoelectric thin film as in Example 1. Finally, the film was annealed at 700° C. for 10 minutes in air with a ramping rate of 30° C./min to form a lithium-doped KNN piezoelectric thin film ($LiNbO_3$—KNN) (LKNN).

By controlling the numbers of the spin coating and the concentration for the U and KNN precursor solutions, a LKNN thin film with a composition of $0.06LiNbO_3$-$0.94$ $(K_{0.5}Na_{0.5})NbO_3$ was obtained.

Results and Conclusions

Figure 3:
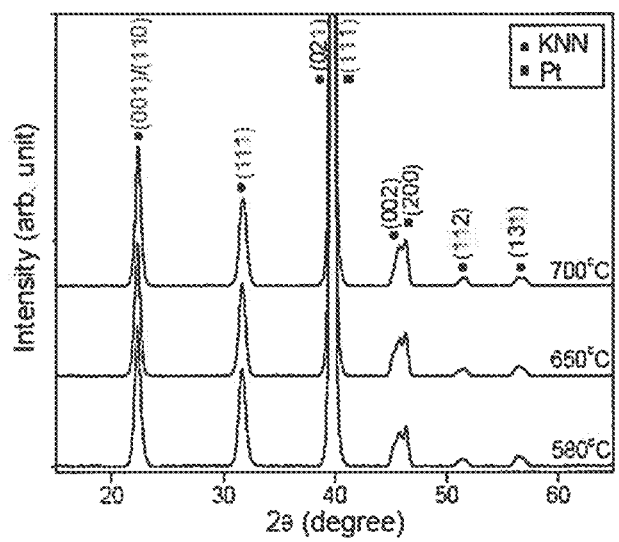
FIG. 3 shows an X-ray diffraction pattern for a KNN piezoelectric thin film prepared according to an embodiment of the method of the present invention and subjected to different annealing temperatures.

FIG. 3 shows the X-ray diffraction pattern for the KNN films obtained in Example 1, which were annealed at three different temperatures. Single perovskite KNN phase with orthorhombic crystallographic symmetry was obtained in all the KNN films.

Figure 4:
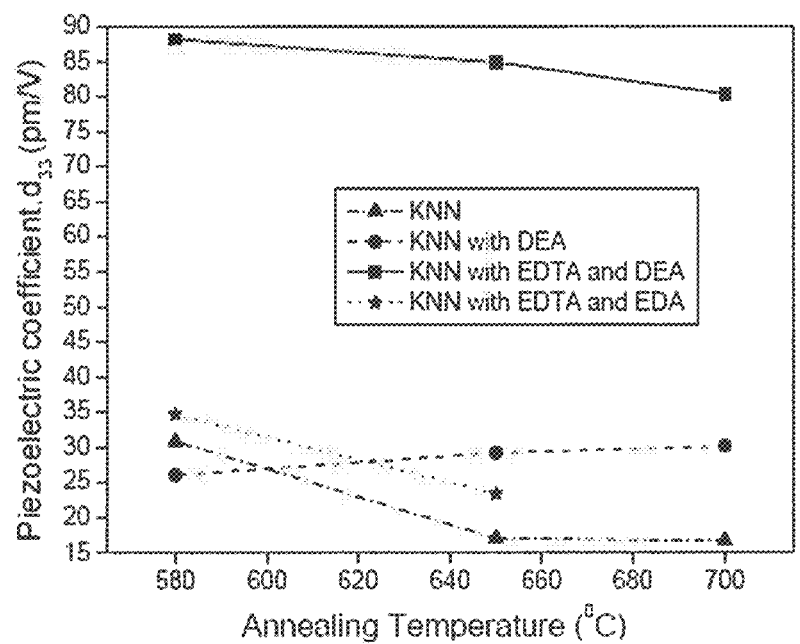
FIG. 4 shows the effective piezoelectric coefficient, d$_{33}$, for KNN piezoelectric thin films prepared according to one embodiment of the method of the present invention using different precursor solutions.

In order to show the outstanding effect of EDTA-DEA on the properties of the resulting KNN film, other KNN precursor solutions containing no chelating agent or chelating agents other than EDTA-DEA, were prepared as described in Examples 2 to 5 in order to produce a number of different KNN piezoelectric thin films. A summary of the effective piezoelectric coefficient $d_{33}$ for the KNN thin films derived from the different chemical precursor solutions of Examples 1 to 5 and annealed at three different temperatures is provided in FIG. 4 and Table 1. For clarity, not all the results summarized in Table are shown in FIG. 4. From FIG. 4 and Table 1, it can be seen that the KNN piezoelectric thin films derived from EDTA-DEA modified solution (Example 1) had effective $d_{33}$ values of 80.3 to 88.2 pm/V, which were outstandingly higher than the KNN piezoelectric thin films prepared from any other precursor solution (Examples 2 to 5).

TABLE 1

Summary of effective piezoelectric coefficient of KNN piezoelectric thin films prepared from the precursor solutions without and with different chelating agents, and annealed at different temperatures.

| | | Effective piezoelectric coefficient, $d_{33}$ (pm/V) | | |
|---|---|---|---|---|
| Chelating agent | Example | 580° C. | 650° C. | 700° C. |
| No chelating agent | 4 | 30.9 | 17 | 16.7 |
| Diethanolamine (DEA) | 3 | 26.0 | 29.2 | 30.1 |

TABLE 1-continued

Summary of effective piezoelectric coefficient of KNN piezoelectric thin films prepared from the precursor solutions without and with different chelating agents, and annealed at different temperatures.

| Chelating agent | Example | Effective piezoelectric coefficient, $d_{33}$ (pm/V) | | |
|---|---|---|---|---|
| | | 580° C. | 650° C. | 700° C. |
| Ethylenediamine (EDA) | 3 | 28.2 | 30.1 | — |
| Acetylacetone (AcAc) | 5 | 32.5 | 29.1 | — |
| Citric acid (CA) | 5 | 19.5 | 21.7 | 29.8 |
| Polyethylene glycol (PEG) | 5 | 29.6 | 15.6 | 19.4 |
| Polyvinylpyrrolidone (PVP) | 5 | 45.9 | 35.3 | 41.5 |
| EDTA-EDA | 2 | 34.7 | 23.4 | — |
| EDTA-DEA | 1 | 88.2 | 84.9 | 80.3 |

The displacement measured by the laser scanning vibrometer was under the in-plane clamping effect of the substrate, which means that the actual piezoelectric coefficients of the KNN piezoelectric films without the in-plane constraint from the substrate should be significantly larger than the values as shown in FIG. 4. This Indicates that the piezoelectric performance of the KNN piezoelectric thin films prepared in this invention (Example 1) reached the magnitude level of the un-doped KNN bulk ceramics (typically 90-120 pm/V). It is also comparable with the effective $d_{33}$ for many PZT piezoelectric films under the similar substrate constraint (70-130 pm/V). Accordingly, the results show that the KNN piezoelectric thin film derived from this invention could replace PZT thin films for many device applications.

As shown in FIG. 4 and Table 1, the effective piezoelectric coefficient $d_{33}$ value of the KNN piezoelectric thin film obtained from Example 2 was only about 25-35 pm/V, which is significantly smaller compared to the KNN piezoelectric thin film obtained from Example 1. The effective piezoelectric coefficient, $d_{33}$, for the KNN piezoelectric thin film obtained from the precursor solution comprising only DEA (Example 3) was about 30 pm/V, which is less than half of the value obtained for the KNN thin films from EDTA-DEA modified solution of Example 1. The effective piezoelectric coefficient of the film obtained from Example 4 was as low as 16-31 pm/V, as shown in Table 1 and FIG. 4. The effective piezoelectric coefficient $d_{33}$ of the films obtained from Example 5 was typically smaller than 46 pm/V, as summarized in Table 1.

Figure 5:
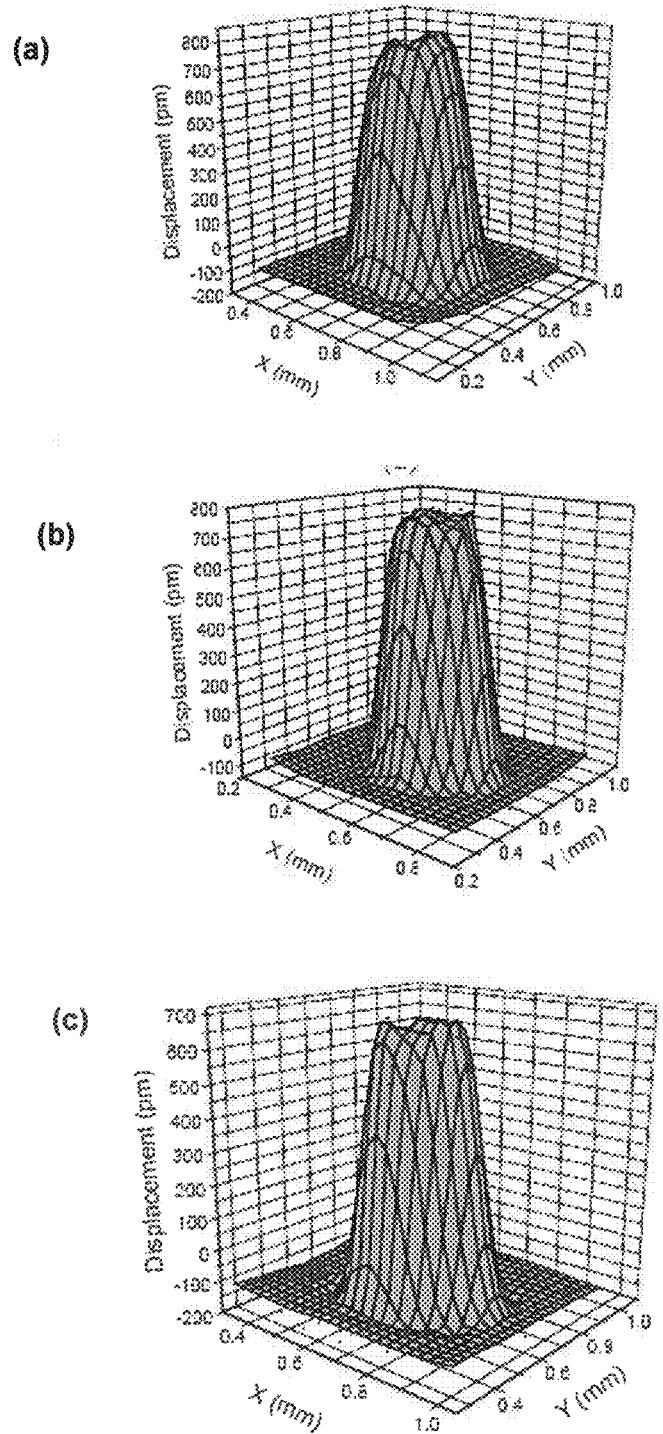
FIG. 5(a) to (c) show the three-dimensional illustrations of the piezoelectric dilatations of the KNN piezoelectric thin films prepared according to one embodiment of the method of the present invention and subjected to annealing temperatures of 580° C., 650° C. and 700° C., respectively.

The three-dimensional drawings of the piezoelectric dilatations of the KNN piezoelectric thin film of Example 1 derived from the precursor solution with EDTA-DEA are presented in FIG. 5(a), 5(b) and 5(c) for the film annealed at 580° C., 650° C., and 700° C., respectively. A unipolar AC voltage with the magnitude of 9.5 V was applied to excite the dilatation of 700 to 800 pm in the KNN piezoelectric thin film.

Figure 6:
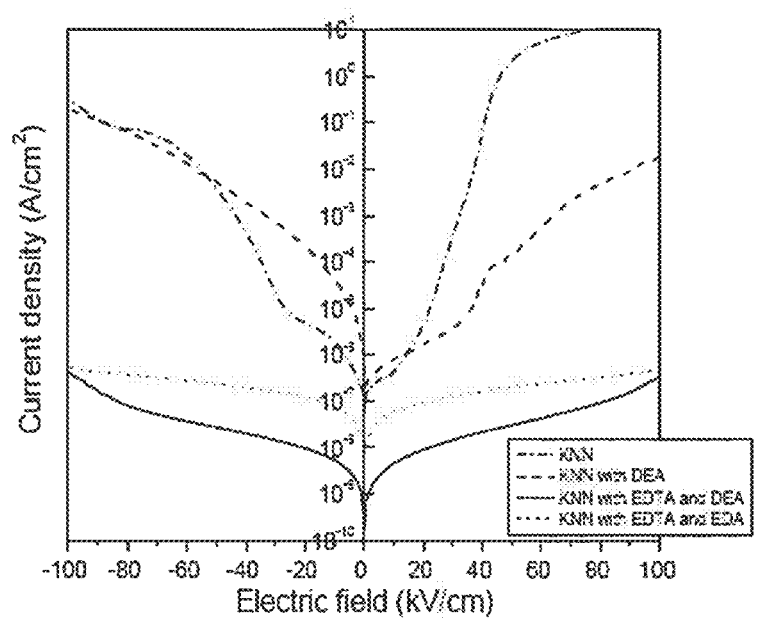
FIG. 6 shows the I-V characteristic of a KNN piezoelectric thin film prepared according to one embodiment of the method of the present invention and annealed at 650° C.

It was found that the KNN piezoelectric thin film of Example 1 prepared from the EDTA-DEA modified precursor solution had significantly reduced leakage current, in comparison with the other KNN thin films prepared from the solution without any chelating agent, or with EDA (Example 3) or DEA (Example 3) separately, or with EDTA and EDA (Example 2), as shown in FIG. 6. Furthermore, the leakage current of the KNN piezoelectric thin films of Example 1 prepared from the EDTA-DEA modified precursor solution was found to be at least one order of magnitude lower than the smallest leakage current as reported in the literature for KNN thin films.

The leakage current of the film obtained from the precursor solution comprising only DEA (Example 3) was also much higher than that from EDTA-DEA (Example 1) and EDTA-EDA (Example 2) modified solutions, as shown in FIG. 6. The leakage current of the film obtained from Example 2 was lower as compared to the KNN thin films from the precursor solution without any chelating agent (Example 4) or with only DEA (Example 3) but is substantially higher than the film obtained from Example 1, as shown in FIG. 6. In particular, the leakage current of the film obtained from Example 4 was higher than all the other KNN thin films derived from the other Examples in which the precursor solution comprised at least one chelating agent, as shown in FIG. 6. The results showed that DEA and EDA not only served as the amine source for promoting the solubility of EDTA in 2-MOE, but also provide strong effects on the resulting properties of the KNN films.

The experimental results as presented in all the examples clearly indicate that improved piezoelectric performance properties can be obtained in the KNN thin films prepared from the chemical precursor solution with EDTA-DEA (Example 1).

In the examples, EDTA and DEA which belong to the polyamino carboxylic acid and alkanolamine groups, respectively, are added into the KNN precursor solutions. It is noted that the introduction of either of them on its own into the precursor solution of KNN does not lead to significantly improved KNN piezoelectric thin films. The reason is that the chelation with EDTA or DEA is not applicable to alkali metal cations, because they do not have any extra orbital for accepting the lone pair electrons from either the oxygen or nitrogen elements in the functional group of the chelating agents.

From the examples, it can be seen that by adding both EDTA and DEA into the KNN precursor solution, the leakage current of the resulting KNN piezoelectric thin films is significantly reduced and the piezoelectric properties are significantly improved. It is believed that the combination of EDTA-DEA or their residuals do have strong interactions with the alkali metal cations in the KNN solution and the thin film during the pyrolysis process. From the FTIR study on the KNN films with and without EDTA-DEA addition and heated at different temperatures (from 100° C. to 580° C.), it is noted that some EDTA and DEA characteristic peaks exist at an elevated temperature until the crystallization temperature (up to 580° C., results not shown). However, based on the thermogravimetric analysis (TGA) of pure EDTA and DEA (results not shown), both compounds decompose completely at temperatures below 300° C. The increase in the decomposition temperature of these two chelating agents may be caused by the interactions of the EDTA and DEA with the precursor chemicals containing the cations and that the resulting chemical network forming between the chelating agents and the metal ions may help to suppress the volatilization of the metal ions. Thermogravimetric analysis-mass spectroscopy (TGA-MS) results (not shown) further proved that the volatility of both the potassium and sodium components were significantly reduced when EDTA and DEA were introduced in the KNN precursor solution as compared to a precursor solution comprising no chelating agents.

It is noted that EDTA and DEA cannot form chelation complex directly through the alkali metal cations, but EDTA and DEA may have ligand exchange with their precursor chemicals. This is because EDTA has a carboxylic group that is similar to the ligand of potassium and sodium acetate while DEA has an alkanol functional group that is similar to the ligand of the niobium ethoxide. Moreover, as compared to both acetate and ethoxide ligands, EDTA and DEA have additional functional groups that are susceptible to hydrogen bonding. Consequently, a huge network linking all the precursor cations can be formed in the solution, which helps to suppress the volatilization of potassium and sodium cations during thermal pyrolysis of the KNN thin films.

The above analysis indicates that the polyamino carboxylic acid and alkanolamine may have a significant impact on suppressing the volatilization of the alkali ions for forming improved piezoelectric oxide thin films having the composition of Group IA-VB, including KNN.

Whilst the foregoing description has described exemplary embodiments, it will be understood by those skilled in the technology concerned that many variations in details of design, construction and/or operation may be made without departing from the present invention.

What is claimed is:

1. A method for preparing a lead-free piezoelectric thin film comprising:
   providing a precursor solution for use in preparing a lead-free piezoelectric thin film comprising: at least one alkali metal ion; a polyamino carboxylic acid; and an alkanolamine;
   depositing the precursor solution on a substrate to form a film; and
   annealing the film.

2. The method according to claim 1, wherein the method further comprises decomposing the film by heating prior annealing.

3. The method according to claim 2, wherein depositing and decomposing are repeated at least once prior to annealing.

4. The method according to claim 1, wherein annealing comprises heating the film at a temperature of about 580-700° C.

5. The method according to claim 1, wherein the lead-free piezoelectric thin film has a formula $(K_{0.5}Na_{0.5})NbO_3$.

6. The method according to claim 1, further comprising depositing a solution comprising lithium ions on the film after annealing.

7. The method according to claim 6, wherein the method comprises heating the film after depositing a solution comprising lithium ions and subsequently annealing the film for a second time.

8. The method according to claim 7, wherein the film has a formula of $0.06LiNbO_3\text{-}0.94(K_{0.5}Na_{0.5})NbO_3$.

* * * * *